US010481246B2

(12) United States Patent
Aksin et al.

(10) Patent No.: US 10,481,246 B2
(45) Date of Patent: Nov. 19, 2019

(54) PHOTO-DIODE EMULATOR CIRCUIT FOR TRANSIMPEDANCE AMPLIFIER TESTING

(71) Applicant: Analog Devices Global Unlimited Company, Hamilton (BM)

(72) Inventors: Devrim Aksin, Istanbul (TR); Yalcin Alper Eken, Istanbul (TR)

(73) Assignee: ANALOG DEVICES GLOBAL UNLIMITED COMPANY, Hamilton (BM)

( * ) Notice: Subject to any disclaimer, the term of this patent is extended or adjusted under 35 U.S.C. 154(b) by 0 days.

(21) Appl. No.: 15/934,138

(22) Filed: Mar. 23, 2018

(65) Prior Publication Data

US 2018/0335509 A1 Nov. 22, 2018

Related U.S. Application Data

(60) Provisional application No. 62/509,559, filed on May 22, 2017.

(51) Int. Cl.
*G01S 7/497* (2006.01)
*G01S 7/481* (2006.01)
(Continued)

(52) U.S. Cl.
CPC .............. *G01S 7/497* (2013.01); *G01R 31/40* (2013.01); *G01S 7/4816* (2013.01); *G01S 17/10* (2013.01); *H03F 3/087* (2013.01); *H03K 3/0315* (2013.01); *H03K 5/14* (2013.01); *H03K 2005/00058* (2013.01)

(58) Field of Classification Search
CPC ........ G01S 7/497; G01S 7/4816; G01S 17/10; H03F 3/087; H03K 3/0315; H03K 5/14; H03K 2005/00058; G01R 31/40; G01R 31/2635; G01R 29/02

See application file for complete search history.

(56) References Cited

U.S. PATENT DOCUMENTS

| 5,636,254 A | * | 6/1997 | Hase ...................... G11B 20/10 331/17 |
| 6,870,629 B1 | * | 3/2005 | Vogel ................... G01M 11/331 356/519 |

(Continued)

OTHER PUBLICATIONS

Jonathan Leu et al., *Injection-Locked Clock Receiver for Monolithic Optical Link in 45nm SOI*, IEEE Asian Solid-State Circuits Conference, Nov. 14-16, 2011, Jeju, Korea, 978-1-4577-1785-7/11 © 2011 IEEE, 4 pages.

(Continued)

*Primary Examiner* — Sang H Nguyen
(74) *Attorney, Agent, or Firm* — Patent Capital Group (57) ABSTRACT

Embodiments of the present disclosure provide an optical range finder that includes a transimpedance amplifier (TIA) and a photodiode emulation circuitry for testing the TIA. The photodiode emulation circuitry may be coupled to an input port of the TIA and configured to receive one or more parameters specifying one or more characteristics of a test current signal to be provided to the TIA. The photodiode emulation circuitry may further be configured to provide the test current signal in accordance with the one or more parameters to the input port of the TIA while the photodiode is also coupled to the input port of the TIA.

21 Claims, 10 Drawing Sheets

(51) Int. Cl.
*G01S 17/10* (2006.01)
*G01R 31/40* (2014.01)
*H03F 3/08* (2006.01)
*H03K 3/03* (2006.01)
*H03K 5/00* (2006.01)
*H03K 5/14* (2014.01)

(56) References Cited

U.S. PATENT DOCUMENTS

| | | | | |
|---|---|---|---|---|
| 9,960,844 | B1* | 5/2018 | Raj | G01R 31/2635 |
| 2004/0100317 | A1* | 5/2004 | Suzunaga | H03G 3/3084 |
| | | | | 327/307 |
| 2005/0022081 | A1* | 1/2005 | Syed | G01R 31/3191 |
| | | | | 714/724 |
| 2005/0110976 | A1* | 5/2005 | LaBelle | G01C 3/08 |
| | | | | 356/5.01 |
| 2005/0249252 | A1* | 11/2005 | Sanchez | H01S 5/06832 |
| | | | | 372/38.07 |
| 2006/0219871 | A1* | 10/2006 | Takahashi | H03F 1/26 |
| | | | | 250/214 R |
| 2007/0098416 | A1* | 5/2007 | Nogami | H03G 3/3084 |
| | | | | 398/208 |
| 2011/0188864 | A1* | 8/2011 | Uo | H04B 10/00 |
| | | | | 398/154 |
| 2011/0270543 | A1* | 11/2011 | Schmidt | G01R 31/2635 |
| | | | | 702/58 |
| 2011/0315858 | A1* | 12/2011 | Heck | G02B 6/4214 |
| | | | | 250/214 A |
| 2012/0281989 | A1* | 11/2012 | Dong | H04B 10/693 |
| | | | | 398/202 |
| 2013/0063191 | A1* | 3/2013 | Patil | H03K 5/1565 |
| | | | | 327/156 |
| 2013/0259470 | A1* | 10/2013 | Zhong | H04B 10/071 |
| | | | | 398/16 |
| 2013/0294546 | A1 | 11/2013 | Emani-Neyestanak et al. | |
| 2014/0001341 | A1* | 1/2014 | Hassibi | G01J 1/44 |
| | | | | 250/208.2 |
| 2014/0225523 | A1* | 8/2014 | Coym | H05B 33/0896 |
| | | | | 315/210 |
| 2016/0359568 | A1* | 12/2016 | De Dobbelaere | G02B 6/4279 |
| 2018/0059339 | A1* | 3/2018 | Gupta | G02B 6/425 |

OTHER PUBLICATIONS

MAX3665 Evaluation Kit, MAXIM, 19-1622, Rev. 0; 1/00, © 2000 Maxim Integrated Products, 6 pages.

Roger Yubtzuan Chen et al.. *A CMOS Optical Receiver for Optoelectronic Integrated Circuits*, 978-1-4244-669-4-8/10 © 2010 IEEE, 4 pages.

Roger Yubtzuan Chen et al., *A CMOS Transimpedance Amplifier for Optical Wireless Communications*, 978-1-4673-6361-7/13 © 2013 IEEE, 4 pages.

Ryan Douglas Bespalko, *Transimpedance Amplifier Design Using 0.18 μm CMOS Technology, A Thesis*, Queen's University, Kingston, Ontario, Canada, © 2007, 153 pages.

Transimpedance Amplifier for Photovoltaic Testing, Laser 2000, © 2009 Artifax Engineering, 9 pages.

Xiaofang Mu, Ph.D., *Challenges in 10GHz Transimpedance Amplifier (TIA) Production Testing*, Vitesse, Jun. 2004, San Diego, 29 pages.

R.Y. Chen et al., *4 Measurement Results*, Intelligent Technologies and Engineering, May 23, 2013, 1 page.

Application Report, *Transimpedance Amplifiers (TIA): Choosing the Best Amplifier for the Job*, Texas Instruments, SNOA942A, Nov. 2015, Revised May 2017, 8 pages.

* cited by examiner

PHOTO-DIODE EMULATOR CIRCUIT FOR TRANSIMPEDANCE AMPLIFIER TESTING

CROSS-REFERENCE TO RELATED APPLICATIONS

This application claims priority to, and the benefits of a U.S. Provisional Application "PHOTO-DIODE EMULATOR CIRCUIT FOR TRANSIMPEDANCE AMPLIFIER TESTING," Ser. No. 62/509,559, filed on May 22, 2017, the entire disclosure of which is hereby incorporated by reference.

TECHNICAL FIELD OF THE DISCLOSURE

The present invention relates to the field of optical range finders, in particular to optical range finders that include photodiodes and transimpedance amplifiers (TIAs).

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Embodiments of the present disclosure provide an optical range finder apparatus/assembly that includes a transimpedance amplifier (TIA) and a photodiode emulation circuitry for testing the TIA. The photodiode emulation circuitry may be coupled to an input port of the TIA and configured to receive one or more parameters specifying one or more characteristics of a test current signal to be provided to the TIA. The photodiode emulation circuitry may further be configured to provide the test current signal in accordance with the one or more parameters to the input port of the TIA while the photodiode is also coupled to the input port of the TIA.

As will be appreciated by one skilled in the art, aspects of the present disclosure, in particular aspects of TIA testing in optical range finder systems proposed herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer readable medium(s), preferably non-transitory, having computer readable program code embodied, e.g., stored, thereon. In various embodiments, such a computer program may, for example, be downloaded (updated) to the existing devices and systems (e.g. to the existing optical range finder systems, and/or controllers of such systems, etc.) or be stored upon manufacturing of these devices and systems.

Other features and advantages of the disclosure are apparent from the following description, and from the claims.

Understanding Optical Systems

Figure 1:
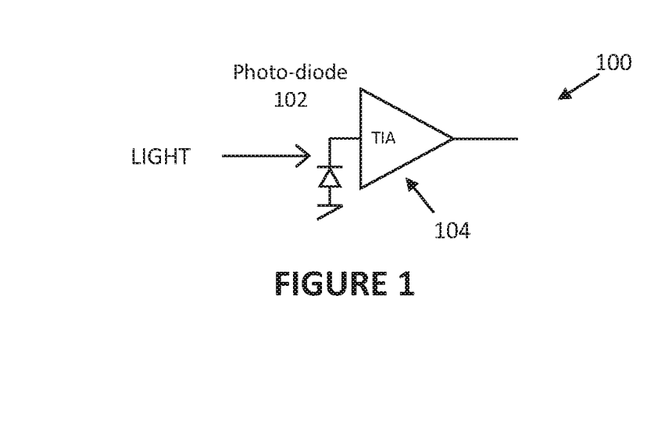
FIG. 1 shows an exemplary optical sensor or optical communication system, according to some embodiments of the disclosure.

Optics are used widely in sensing and communications. For both optical sensing and optical communications, light is typically sensed or detected by an optical detector (referred to in the following as a "photo-diode," which term implies any suitable optical detector device), and a current signal generated by the photo-diode is subsequently converted to voltage usable by the system. FIG. 1 shows an exemplary optical sensor or optical communication system 100, according to some embodiments of the disclosure. The optical sensor or optical communication system includes a photo-diode detector 102 for sensing light, and a transimpedance amplifier (TIA) 104 for converting a current generated by photo-diode detector 102 into voltage. Photodetector and photo-diode may be used interchangeably herein.

In particular, optical sensors applications or optical communication links, an (input) photo-detector 102 and a bias supply (reversely biasing photo-diode detector 102) are utilized as a time-dependent input current source to a modulated light beam illuminating the photo-detector 102. This input current is then subsequently converted to a voltage VOUT by a transimpedance amplifier (TIA) 104.

Characteristics of the Input Current Generated by the Photo-Diode Detector

Figure 2:
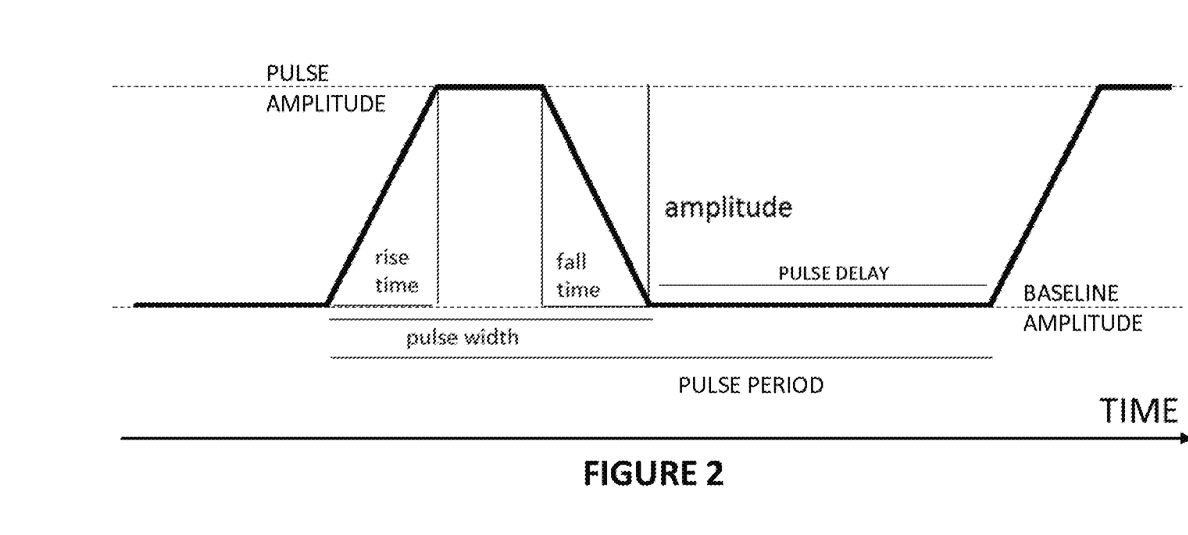
FIG. 2 illustrates a signal shape of an input current signal, according to some embodiments of the disclosure.

Generated current signals for the above mentioned applications have wide range of shapes. FIG. 2 illustrates a signal shape (namely, a pulse) of an input current signal to the TIA, according to some embodiments of the disclosure. The wide range of shapes of the current pulses as are typically present in optical range finding systems can be generally represented with the signal shape shown with the following variabilities: amplitude, pulse width, rise time, fall time, and pulse period. During each pulse, the current rises to a particular pulse amplitude and falls back to a baseline amplitude. The difference between the pulse amplitude and the baseline amplitude is defined as the amplitude herein. The rise and fall of the current has a particular pulse width, rise time, and fall time. Pulses are separated by pulse delay periods, i.e., periods where current has baseline amplitude, zero or near zero temperature coefficient and known amplitude. The pulse period is the total of the pulse width and the pulse delay.

Testing the Transimpedance Amplifier is a Challenge

Testing of TIA, especially for high speed applications, e.g. as those implemented by optical range finders, is a challenge. For instance, the rise/fall time can be as little as 150 picoseconds. High speed test equipment may require 50 Ohm termination within the operating frequency. The input impedance of the TIA is not necessarily equal to 50 Ohm. Furthermore, generating and delivering high speed current pulses can be difficult. A current output node with very low parasitic inductance and capacitance may be necessary.

Figure 3:
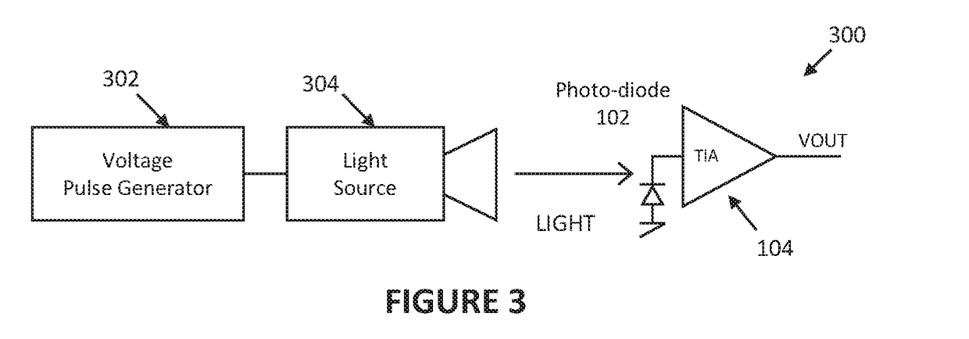
FIG. 3 shows an optical test setup for testing an exemplary optical sensor or optical communication system, according to some embodiments of the disclosure.

The common practice to address these testing challenges is to develop an optical test setup, as e.g. shown in FIG. 3 illustrating an optical test setup for testing an exemplary optical sensor or optical communication system. The optical test setup includes a voltage pulse generator with its output driving a light source 304 to generate light which can be detected by photo-diode detector 102. With the proper test setup, the photo-diode detector 102 would generate current that can be used for testing the TIA 104. This approach of providing an optical test setup increases test cost and complexity. Furthermore, while some high-speed voltage pulse generators have amplitude and duty cycle controls, high-speed voltage pulse generators do not have rise and fall time control. This could complicate the ability to generate the current shape desired for testing the TIA 104. For most cases the test cost and complexity increase prohibits this setup to be utilized during the production testing.

Photo-Diode Emulator Circuit

Embodiments of the present disclosure are based on a realization that instead of using an optical test setup, a TIA can be tested using a photo-diode emulator circuit. Specifically, the photo-diode emulator circuit for TIA testing can generate a desired current signal for testing the TIA 104 having a current shape that has a specified set of characteristics: amplitude, pulse width, rise time, fall time, and pulse period. These characteristics can vary depending on the optical system. Providing the photo-diode emulator circuit to meet the requirements/specifications of the optical system is not trivial.

Figure 4:
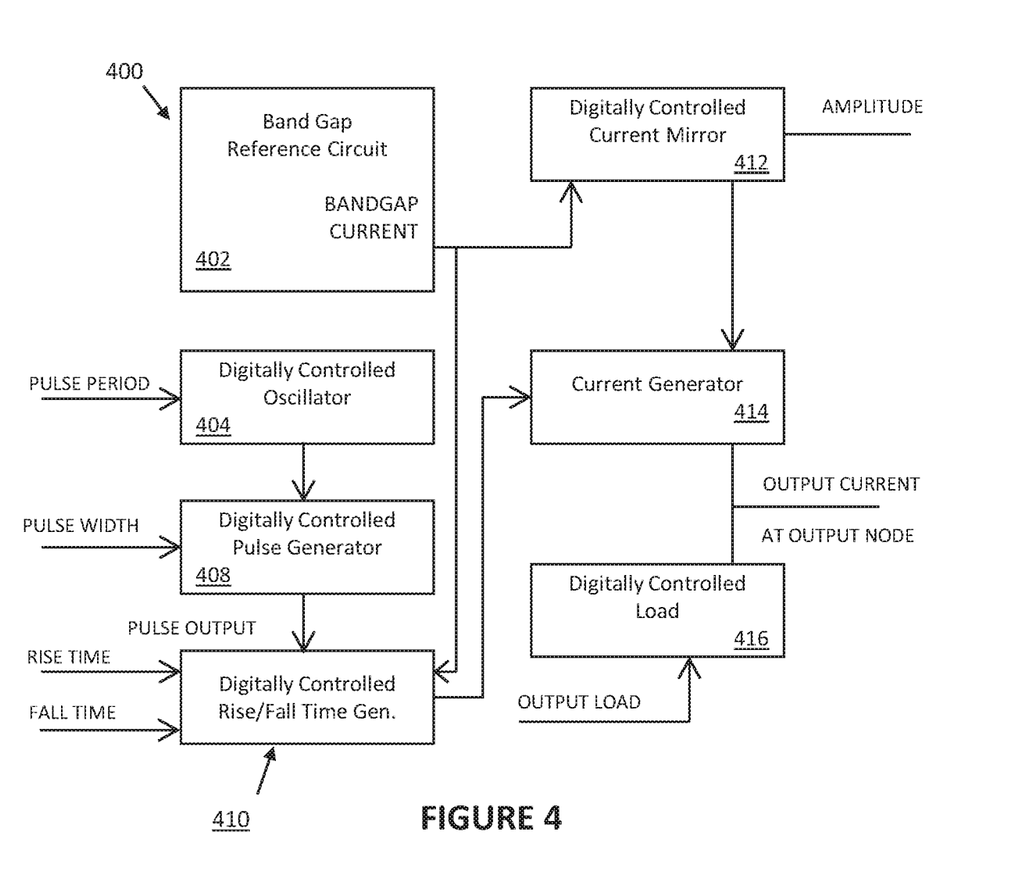
FIG. 4 is a block level circuit topology of an exemplary photo-diode emulator circuit, according to some embodiments of the disclosure.

FIG. 4 is a block level circuit topology of an exemplary photo-diode emulator circuit that may be used in an optical range finder, according to some embodiments of the disclosure. An optical range finder may be e.g. a light detection and ranging (LIDAR) system, where optical sensors, e.g. photo-diodes as described herein, are provided for measuring light incident thereon in order to determine distance to objects. An exemplary LIDAR system may include a light source and a light sensor, e.g. a photo-diode, configured to implement time-of-flight measurements to determine distance information to one or more objects, and a storage array configured to store analog values indicative of the light sensor readings.

The photo-diode emulator circuit 400 may include one or more of the following circuits/blocks: bandgap reference circuit 402, digitally controlled oscillator 404, digitally controlled pulse generator 408, digitally controlled rise/fall time generator 410, digitally controlled current mirror 412, current generator 414, and digitally controlled load 416. In operation, the photo-diode emulator circuit 400 may receive, or otherwise have access to, one or more of the following inputs: amplitude ("AMPLITUDE"), pulse period ("PULSE PERIOD"), pulse width ("PULSE WIDTH"), rise time ("RISE TIME"), and fall time ("FALL TIME"), which can control or adjust different characteristics of the current shape of the current signal generated at the output node of the emulator circuit. The photo-diode emulator circuit 400 may further receive, or otherwise have access to, an output load control input ("OUTPUT LOAD") for controlling the load capacitance being emulated. Advantageously, the photo-diode emulator circuit 400 can generate a desired current shape at the output "OUTPUT CURRENT") without the need for an optical test setup, while being able to controllably and flexibly provide such desired current shape, even in high speed applications.

Although some figures may illustrate that various parameters/characteristics are controlled through digital (discrete) control signals, this is not a necessity. In other embodiments, one or more of the blocks being controlled can easily be converted to continuously controlled blocks. Although specific circuit implementation of each sub block can differ depending on the desired parameter range, exemplary implementations are described and shown herein for illustration and appreciation of the non-trivial circuit design.

Bandgap Reference Circuit

Turning to the different blocks shown in FIG. 4, the bandgap reference circuit 402 may be configured to generate current having a baseline amplitude, zero, or near zero temperature coefficient, and a known amplitude. The bandgap current may be provided to the digitally controlled current mirror 412 and the digitally controlled rise/fall time generator 410. A bandgap reference circuit can be implemented to generate a desired reference current having the baseline amplitude. Depending on the process technology and supply voltage, the circuitry can differ; generally speaking, the bandgap reference circuit can include one or more transistors and/or one or more current mirrors, which can generate a controlled and stable current having the known amplitude and zero (or near zero) temperature coefficient.

Digitally Controlled Oscillator

Figure 5:
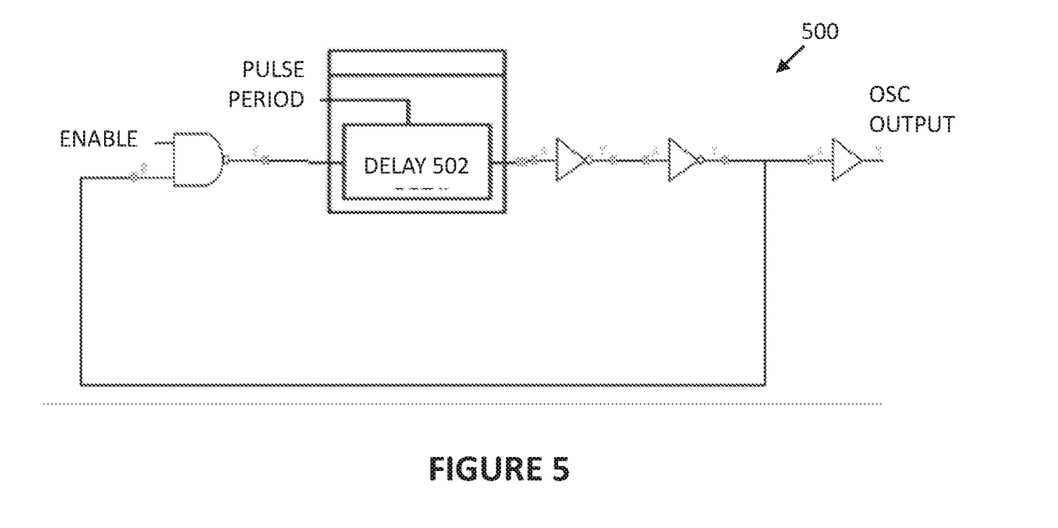
FIG. 5 shows an exemplary digitally controlled oscillator, according to some embodiments of the disclosure.

The digitally controlled oscillator 404 of FIG. 4 may be configured to ensure that the current pulses are generated with the appropriate pulse period. Thus, the digitally controlled oscillator 404 may generally include any suitable circuits that control timing, such as e.g. the one shown in FIG. 5. FIG. 5 shows an exemplary digitally controlled oscillator 500, according to some embodiments of the disclosure. In this example, the digitally controlled oscillator 500 is implemented using a ring oscillator with a variable delay line 502 introduced within the loop. As shown in FIG. 5, the digitally controlled oscillator 500 has enable input ("ENABLE") and pulse period control input ("PULSE PERIOD") and an output ("OSC OUTPUT"). The pulse period control input ("PULSE PERIOD") adjusts the delay being provided by the variable delay line 502.

When enabled, the digitally controlled oscillator 500 may generate a pulse signal whose period is determined by the delay introduced by the variable delay line with around 50% duty cycle.

Figure 6:
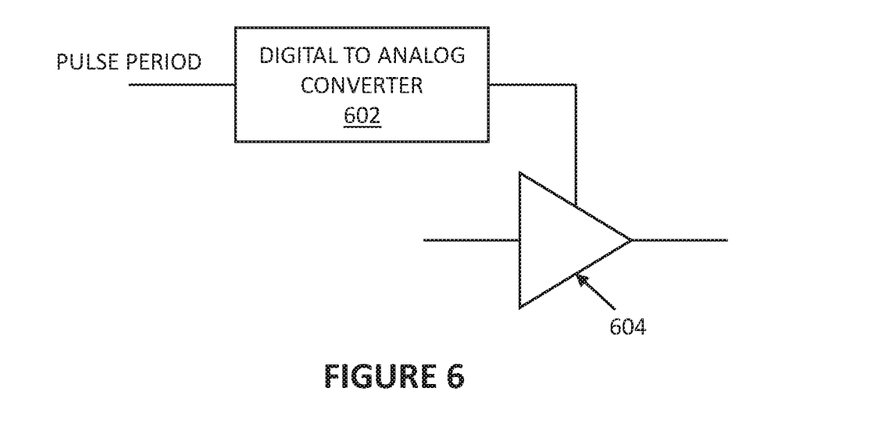
FIG. 6 shows an exemplary digitally controlled delay line, according to some embodiments of the disclosure.

The variable delay line 502 can be a digitally controlled delay line, e.g. such as the one shown in FIG. 6. FIG. 6 shows an exemplary digitally controlled delay line 600, according to some embodiments of the disclosure. The pulse period control input ("PULSE PERIOD") may be fed to a digital to analog converter 602 controlling the supply line of a digital buffer 604. The supply line may modulate the propagation delay of the digital buffer 604.

Digitally Controlled Pulse Generator

Figure 7:
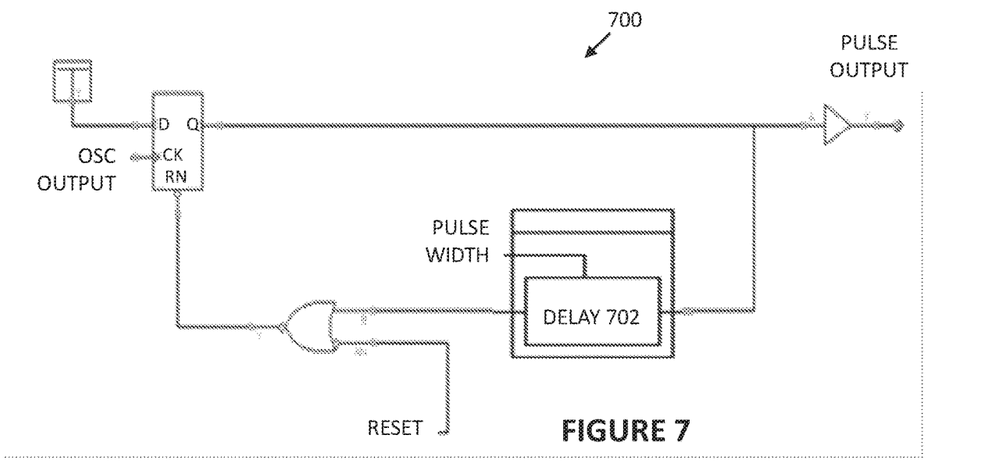
FIG. 7 shows an exemplary digitally controlled pulse generator, according to some embodiments of the disclosure.

The digitally controlled pulse generator 408 of FIG. 4 may be configured to ensure the current pulses are generated with the appropriate pulse width. Thus, the digitally controlled pulse generator 408 generally includes circuits that control timing, such as e.g. shown in FIG. 7. FIG. 7 shows an exemplary digitally controlled pulse generator 700, according to some embodiments of the disclosure. In some embodiments, a digitally controlled pulse generator may be implemented using a glitch generator with a variable delay line 702 introduced within the loop. The digitally controlled pulse generator block may have oscillator output as input ("OSC OUTPUT"), reset ("RESET"), pulse width control input ("PULSE WIDTH") and pulse output ("PULSE OUTPUT"). The oscillator output may be generated by the digitally controlled oscillator 404 of FIG. 4. The pulse width control input ("PULSE WIDTH") may adjust the delay being provided by the variable delay line 702.

When reset is removed, the digitally controlled pulse generator 700 may generate, at the rising edge of the oscillator output signal ("OSC OUTPUT"), a glitch signal whose width is controlled by the delay introduced by the variable delay line 702 with a pulse period set by the oscillator output period (of "OSC OUTPUT").

In some embodiments, the variable delay line 702 can be a digitally controlled delay line. One possible implementation was previously described with respect to FIG. 6.

Digitally Controlled Rise/Fall Time Generator, Digitally Controlled Current Mirror, and Current Generator The digitally controlled rise/fall time generator 410 may be configured to operate with digitally controlled current mirror 412 of FIG. 4, in current generator 414, to provide a final output current having the desired characteristics. While the digitally controlled rise/fall time generator 410 may control the rise/fall time, the digitally controlled current mirror 412 may control the amplitude of the current pulses.

Figure 8:
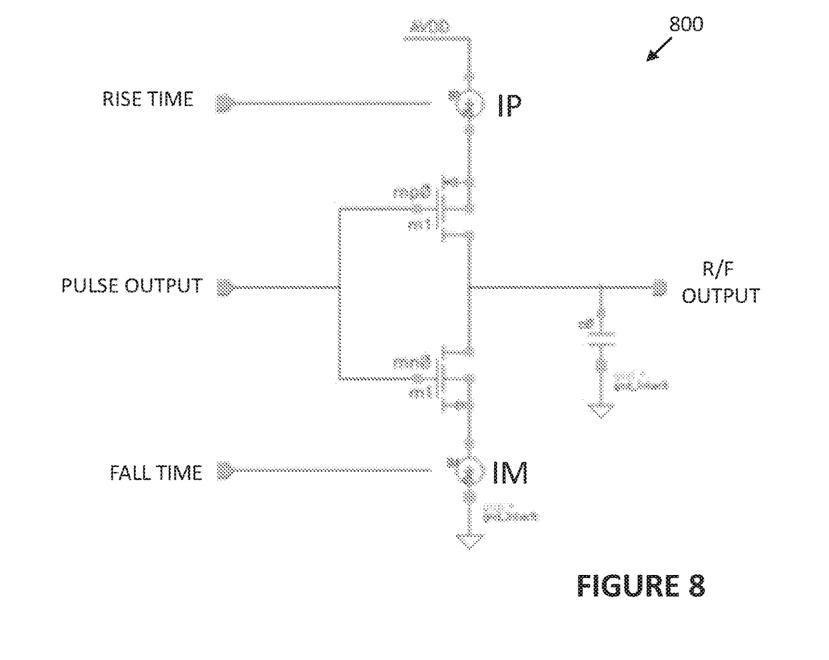
FIG. 8 shows an exemplary digitally controlled rise/fall time generator, according to some embodiments of the disclosure.

The digitally controlled rise/fall time generator 410 of FIG. 4 ensures the current has appropriate rise time and fall time. Thus, the digitally controlled rise/fall time generator 410 generally includes circuits that modulates signal (e.g., controlling the rate at which the signal rises and falls). FIG. 8 shows an exemplary digitally controlled rise/fall time generator 800, according to some embodiments of the disclosure. In some embodiments, the digitally controlled rise/fall time generator 800 may be implemented using current starving inverter architecture. The digitally controlled rise/fall time generator 800 may have pulse generator output as input ("PULSE OUTPUT"), rise time control input ("RISE TIME"), fall time control input ("FALL TIME"), and an output ("R/F OUTPUT"). The digitally controlled rise/fall time generator 800 may further include current sources, shown as "IP" and "IM" blocks, controllable by rise time control input ("RISE TIME") and fall time control input ("FALL TIME").

The rise time control input ("RISE TIME") and fall time control input ("FALL TIME") may adjust the rate at which the signal rises and falls. In particular, the rise time control input ("RISE TIME") and fall time control input ("FALL TIME") may modulate the amount of current that can be sunk or sourced to the output, hence determining the output voltage ("R/F OUTPUT") change rate (and rise and fall time). The rise time control input ("RISE TIME") and fall time control input ("FALL TIME") can be fed to digitally controlled current sources ("IP" and "IM") to modulate rise and fall time of the output signal ("R/F OUTPUT"). In various embodiments, these current sources can be implemented as digitally controlled current mirror blocks or using any suitable current source implementations.

Figure 9:
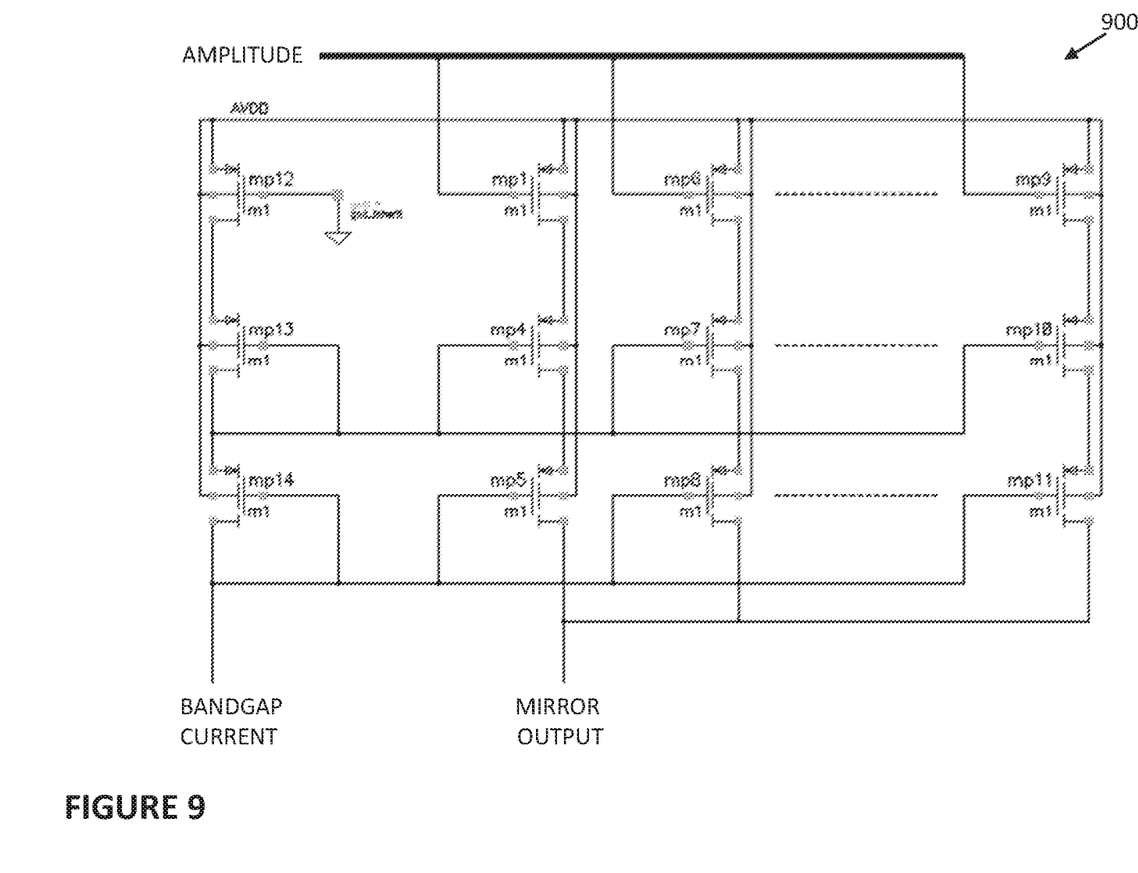
FIG. 9 shows an exemplary digitally controlled current mirror, according to some embodiments of the disclosure.

The digitally controlled current mirror 412 of FIG. 4 ensures the final output current has appropriate amplitude. Thus, the digitally controlled rise/fall time generator 410 generally includes circuits that provide a current mirror that has controllable amplitude, such as e.g. shown in FIG. 9. FIG. 9 shows an exemplary digitally controlled current mirror 900, according to some embodiments of the disclosure. The digitally controlled current mirror has a plurality of current branches to generate current according to a particular pulse amplitude. The digitally controlled current mirror may have bandgap current as input ("BANDGAP CURRENT"), amplitude control input ("AMPLITUDE") and a current output ("MIRROR OUTPUT"). Amplitude control input ("AMPLITUDE") may enable or disable current branches to increase or decrease the current mirroring ratio and consequently the current output ("MIRROR OUTPUT").

Figure 10:
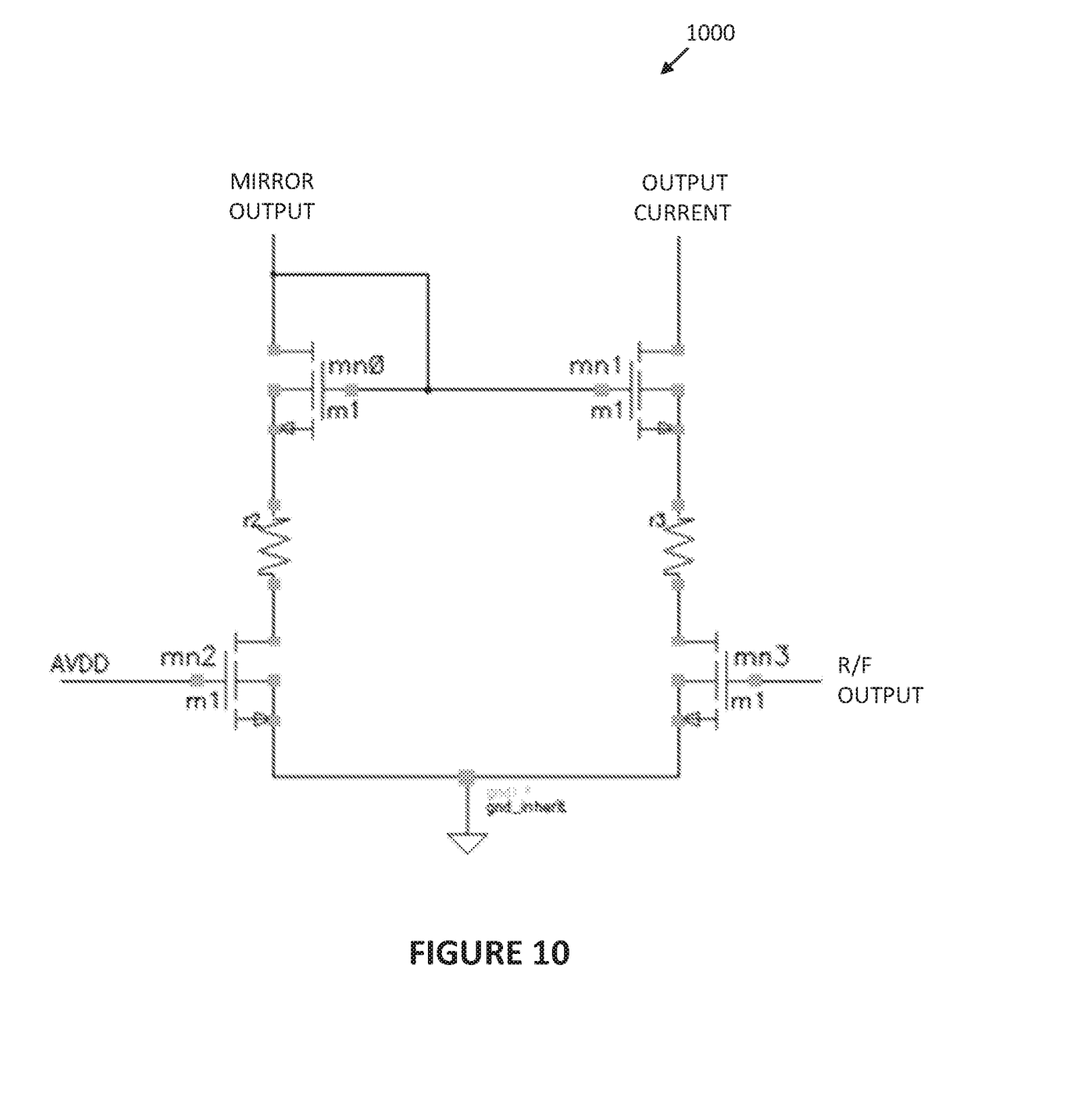
FIG. 10 shows an exemplary current generator, according to some embodiments of the disclosure.

The current generator 414 of FIG. 4 may provide the final output current having the specifications of the current shape. FIG. 10 shows an exemplary current generator 1000, according to some embodiments of the disclosure. The current generator 1000 can include a current mirror. The current generator 1000 may have rise/fall time generator output as input ("R/F OUTPUT"), current mirror output as input ("MIRROR OUTPUT"), and output current as output ("OUTPUT CURRENT"). A MOS transistor mn3, modulated by "R/F OUTPUT", may be configured to turn the output current ("OUTPUT CURRENT") on and off. The magnitude of the output current may be set by the output from the current mirror ("MIRROR OUTPUT"). The pulse width, period, rise time and fall time of the output current ("OUTPUT CURRENT") may be set by the output from the rise/fall time generator ("R/F OUTPUT").

Digitally Controlled Load

Figure 11:
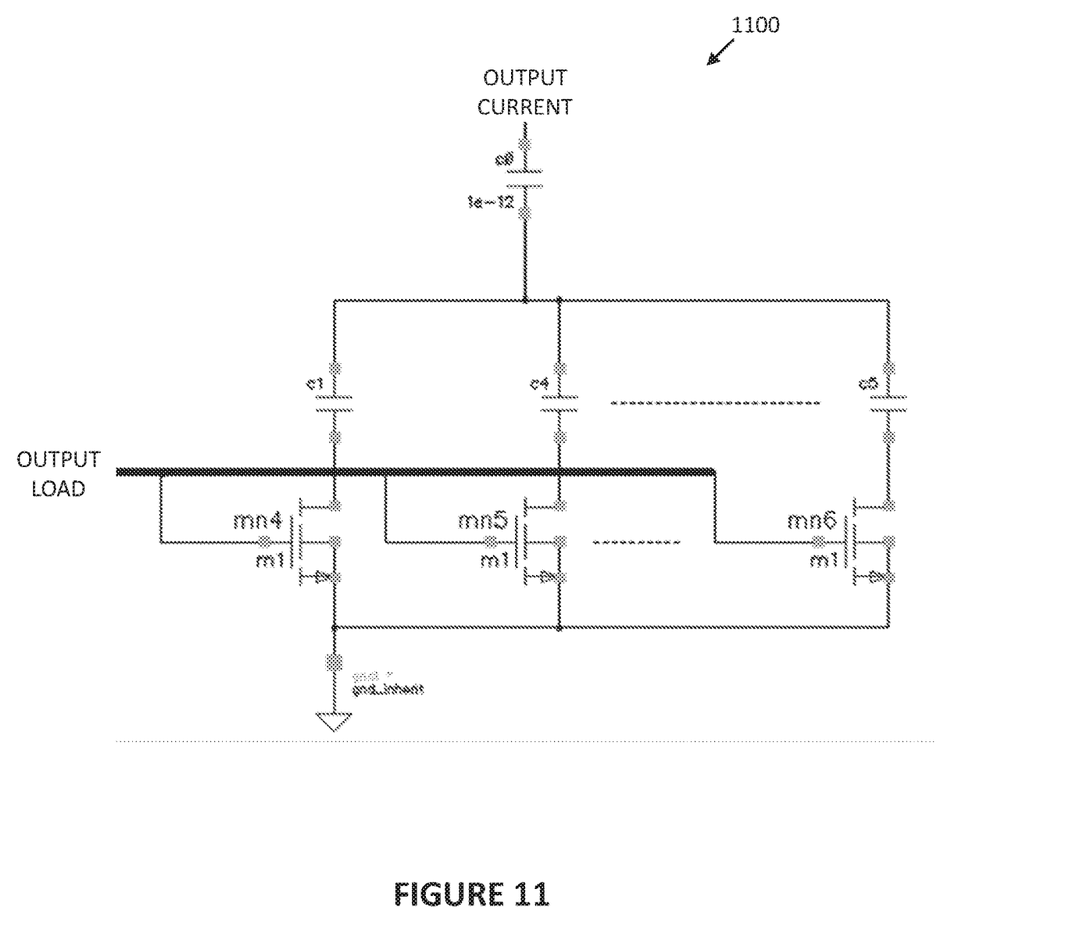
FIG. 11 shows an exemplary digitally controlled load, according to some embodiments of the disclosure.

Digitally controlled load 416 of FIG. 4 may be configured to emulate the load capacitance of the photo-diode, and, in some embodiments, may generally include switchable capacitors. FIG. 11 shows an exemplary digitally controlled load 1100, according to some embodiments of the disclosure. In this example, a bank of switchable capacitors having capacitors and transistors is included for the digitally controlled load. An output load control input ("OUTPUT LOAD") can selectively switch the capacitors in or out to control or adjust the load capacitance. As a result, digitally control load can modulate the amount of capacitance seen from the output node ("OUTPUT CURRENT").

Alternative Block Level Circuit Topology

Figure 12:
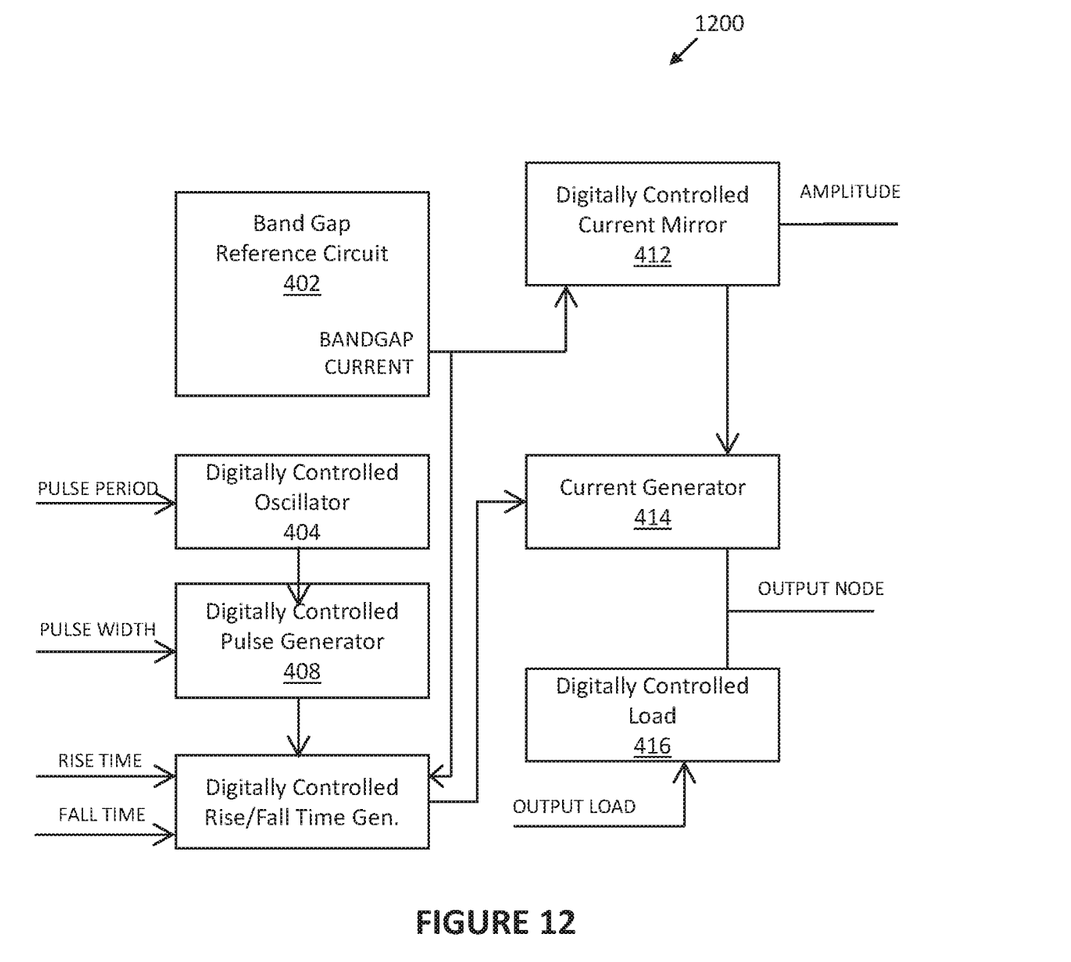
FIG. 12 is another block level circuit topology of an exemplary photo-diode emulator circuit, according to some embodiments of the disclosure.

FIG. 12 is another block level circuit topology of an exemplary photo-diode emulator circuit 1200, according to some embodiments of the disclosure. As an alternative approach, embodiments of FIG. 12 illustrate that one or more of "digitally controlled oscillator", "digitally controlled pulse generator", or "digitally controlled rise/fall time generator" shown in FIG. 4 can be replaced with one or more external signal generator bypassing these blocks. Phrased differently, one or more external signals 1-2-3 ("EXTERNAL SIGNAL-1", "EXTERNAL SIGNAL-2", "EXTERNAL SIGNAL-3", and "EXTERNAL SIGNAL-4") can be injected to these nodes to replace internal functionality, i.e., signals "OSC OUTPUT", "PULSE OUTPUT", "R/F OUTPUT", and "MIRROR OUTPUT" respectively.

System Architecture and Considerations

Figure 13:
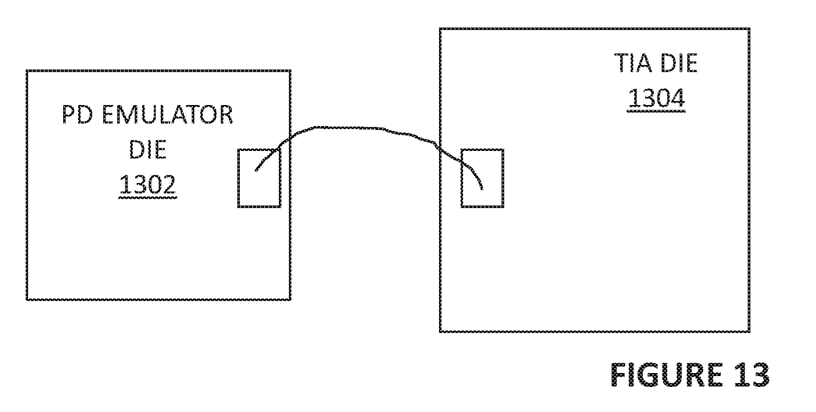
FIG. 13 shows an exemplary implementation of the photo-diode emulator circuit, according to some embodiments of the disclosure.

In some embodiments, any of the photo-diode emulator circuits described herein can be implemented as a separate integrated circuit (i.e., on a different die from the TIA die), replicating the assembly of a real photodiode-TIA connection. FIG. 13 shows an exemplary implementation of the photo-diode emulator circuit, which can be any of the photo-diode emulator circuits described herein, according to some embodiments of the disclosure. As shown in FIG. 13, in such embodiments, two separate dies, photo-diode emulator die 1302 and TIA die 1304, may be used to provide the test setup. In this exemplary implementation, the photo-diode emulator circuit can advantageously emulate any bondwire inductance of the photo-diode TIA interface.

Figure 14:
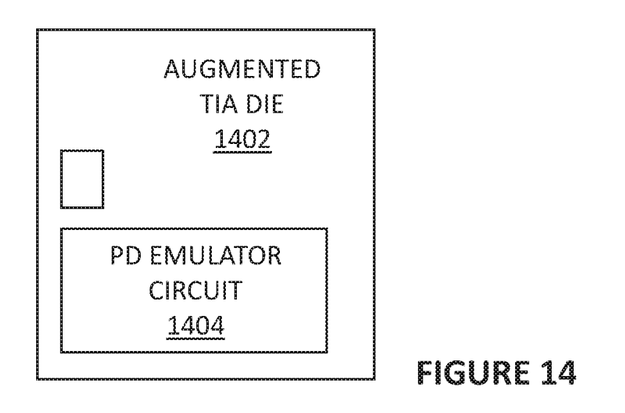
FIG. 14 shows another exemplary implementation of the photo-diode emulator circuit, according to some embodiments of the disclosure.

Alternatively, in other embodiments, a photo-diode emulator circuit can be implemented on the same die as the TIA, which may simplify the production testing of the TIA. The on-die implementation can be more suitable for testing faster systems due to the lower parasitics at the output nodes. FIG. 14 shows another exemplary implementation of a photo-diode emulator circuit, according to some embodiments of the disclosure. As shown in FIG. 14, the photo-diode emulator circuit 1402 may be provided on the same die as the (augmented) TIA die 1402. In such implementations, during production test, the emulator circuit 1404 may be shorted to the input of the TIA through a probe card. The probe card may ensure that the emulator circuit is not connected directly to the TIA to avoid capacitive loading of the input and associated performance degradation under normal operation. A "jumper" probe configuration provided by the probe card can selectively connect the emulator output pad ("OUTPUT CURRENT") to the TIA input pad during testing.

Exemplary Method

Figure 15:
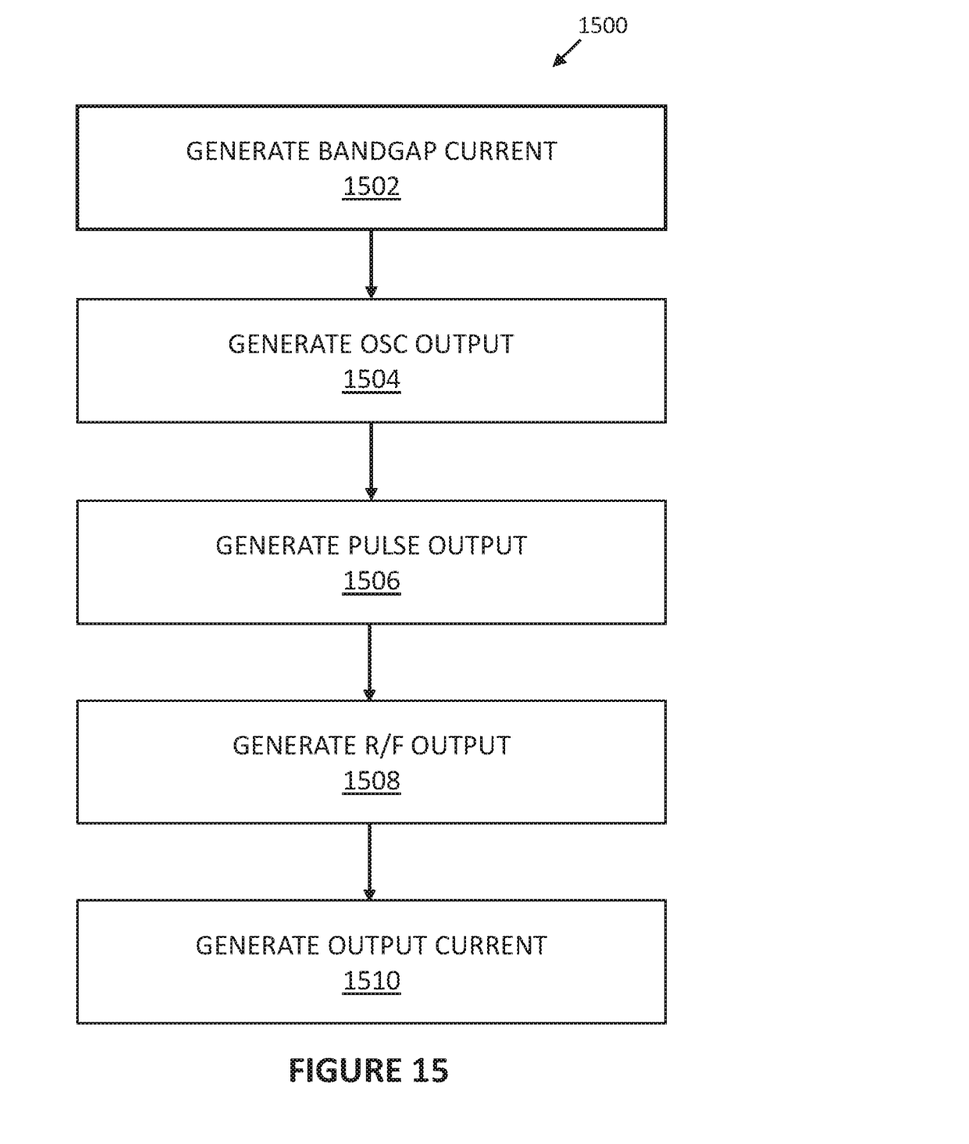
FIG. 15 is a flow diagram illustrating a method for generating a current to emulate a photo-diode.

FIG. 15 is a flow diagram illustrating a method 1500 for generating a current to emulate a photo-diode. The method is explained with respect to the signals illustrated in FIG. 4. In task 1502, the bandgap reference circuit 402 may generate bandgap current ("BANDGAP CURRENT"). In task 1504, the digitally controlled oscillator 404 may generate output ("OSC OUTPUT"). In task 1506, the digitally controlled pulse generator 408 may generate output ("PULSE OUTPUT"). In task 1508, the digitally controlled rise/fall time generator 410 may generate output ("R/F OUTOUT"). In task 1510, digitally controlled rise/fall time generator 410, digitally controlled current mirror 412, current generator 414, and digitally controlled load 416 generate output current ("OUTPUT CURRENT").

Advantages Over Other Photo-Diode Emulating Circuits

Some circuits have been proposed for emulating a photodiode, but many of them do not provide for all the control that the embodiments disclosed herein offers. For instance, some systems do not provide pulse width, and rise/fall time control, which can be important for some applications of the photo-diode emulation circuit.

Some circuits may switch the current signal at the output node. The output node is connected to a high gain amplifier, which can be very sensitive. The switching techniques described herein is not directly coupled to the output node, and therefore, it would not inject noise from the voltage source to the output through MOS transistor drain to gate capacitive coupling.

In some applications where the current levels to be switched has a large dynamic range (e.g., 10 uA to 10 mA, change in 3 or more orders of magnitude, or requiring current greater than 10 mA), the use of bipolar devices at the current generator output can be made part of the design of the photodiode emulator circuit. The use of bipolar devices can be advantageous for several reasons. For example, the bipolar devices can provide low parasitic capacitance at the collector terminal or at output node. Furthermore, bipolar devices may be considerably faster than metal-oxide semiconductor (MOS) transistors.

In some embodiments described herein, the photo-diode emulator circuit is provided on a separate die (not on the same die as the TIA). In these cases, the photo-diode emulator circuit can provide an additional feature of emulating the effect of the photo-diode connection bondwire inductance. Advantageously, the behavior and characteristics of the photo-diode can be more accurately imitated by the photo-diode emulator circuit.

Variations and Implementations

Presented schematics are created so that the output current is sink from the output node (indicated "OUTPUT CURRENT AT OUTPUT NODE" of FIG. 4). It is possible to utilize complementary architecture for the current generator 414 and digitally controlled current mirror 412 so that the output current is sourced to the output node.

Note that the activities discussed above with reference to the FIGURES are applicable to any integrated circuits that involve a photo-diode which drives the input of a TIA. The disclosed embodiments can be used to emulate the photodiode to test the TIA. Typically these integrated circuits are used in a variety of optical systems. In some cases, the embodiments described herein can be used in optical range finders.

It is possible to implement whole topology using metal-oxide semiconductor (MOS) devices or bipolar devices or a mixed of both depending on the desired performance level and the available technology. MOS transistors body connection can be either to their source terminal or to the supply terminal. Complementary or equivalent configurations (using BJTs in place of MOS transistors) would be considered interchangeable with embodiments described herein using MOS transistors to a person with ordinary skill in the art.

The digital cells can be implemented using complementary metal-oxide semiconductor (CMOS) digital cell implementation or Emitter/Source coupled logic implementation. The choice may be related to the desired performance level and the available technology.

Complementary/equivalent configurations using different transistor types are also envisioned by the disclosure. For instance, NMOS devices can be replaced by PMOS devices. The circuits using PMOS devices would be configured in an "upside-down" manner compared to the ones disclosed herein using NMOS devices. Varied implementations are equivalent to the disclosed implementations using NMOS transistors devices because the varied implementations would perform substantially the same function in substantially the same way to yield substantially the same result.

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

Parts of various apparatuses for emulating the photo-diode can include electronic circuitry to perform the functions described herein. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to photo-diode emulation, illustrate only some of the possible functions that may be carried out by the circuitry illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

The invention claimed is:

1. An optical range finder, comprising:
a transimpedance amplifier (TIA); and
a photodiode emulation circuitry coupled to an input port of the TIA and configured to:
receive one or more parameters specifying one or more characteristics of a test current signal to be provided to the TIA, and
provide the test current signal in accordance with the one or more parameters to the input port of the TIA while the photodiode is also coupled to the input port of the TIA,
wherein:
the test current signal includes a current pulse,
the one or more characteristics include an amplitude of the current pulse, and
the photodiode emulation circuitry includes a digitally controlled current mirror configured to ensure that the amplitude of the test current signal is in accordance with the one or more parameters.

2. The optical range finder according to claim 1, wherein the test current signal includes a periodic signal comprising a plurality of pulses, and wherein the one or more characteristics further include a pulse period of the plurality of pulses.

3. The optical range finder according to claim 2, wherein the photodiode emulation circuitry includes a digitally controlled oscillator configured to ensure that the pulse period of the test current signal is in accordance with the one or more parameters.

4. The optical range finder according to claim 3, wherein the digitally controlled oscillator includes a ring oscillator with a variable delay line.

5. The optical range finder according to claim 4, wherein the variable delay line is a digitally controlled delay line.

6. The optical range finder according to claim 1, wherein the one or more characteristics further include a pulse width of the current pulse.

7. The optical range finder according to claim 6, wherein the photodiode emulation circuitry includes a digitally controlled pulse generator configured to ensure that the pulse width of the test current signal is in accordance with the one or more parameters.

8. The optical range finder according to claim 7, wherein the digitally controlled oscillator includes a glitch generator with a variable delay line.

9. The optical range finder according to claim 1, wherein the one or more characteristics further include a rise time and a fall time of the current pulse.

10. The optical range finder according to claim 9, wherein the photodiode emulation circuitry includes a digitally controlled rise/fall time generator configured to ensure that the rise time and the fall time of the test current signal is in accordance with the one or more parameters.

11. The optical range finder according to claim 10, wherein the digitally controlled rise/fall time generator includes a current starving inverter.

12. The optical range finder according to claim 1, wherein the test current signal is a current signal generated in absence of optical-to-electrical conversion.

13. The optical range finder according to claim 1, wherein:
the test current signal includes a current pulse,
the one or more characteristics include an amplitude of the current pulse, and
the photodiode emulation circuitry includes a digitally controlled current source configured to ensure that the amplitude of the test current signal is in accordance with the one or more parameters.

14. The optical range finder according to claim 1, wherein the optical range finder is a light detection and ranging (LIDAR) system.

15. The optical range finder according to claim 1, further comprising a light source and a light sensor, wherein the light source and the light sensor are configured to implement time-of-flight measurements to determine distance information to one or more objects.

16. An optical range finder comprising:
an integrated circuit (IC) device that includes a die, the die including:
a transimpedance amplifier (TIA),
a photodiode emulation circuitry configured to:
receive one or more parameters specifying one or more characteristics of a test current signal to be provided to the TIA,
generate the test current signal in accordance with the one or more parameters, and
provide the test current signal to the TIA,
wherein the photodiode emulation circuitry includes:
a reference current generator configured to generate a reference current,
a digitally controlled oscillator configured to generate a first voltage signal as a periodic signal comprising a plurality of pulses, where the one or more characteristics include a pulse period and the digitally controlled oscillator is configured to ensure that a pulse period of the first voltage signal is in accordance with the pulse period specified by the one or more parameters,
a digitally controlled pulse generator configured to generate a second voltage signal based on the first voltage signal, where the one or more characteristics include a pulse width and the digitally controlled oscillator is configured to ensure that a pulse width of the second voltage signal is in accordance with the pulse width specified by the one or more parameters,
a digitally controlled rise/fall time generator configured to generate a third voltage signal based on the second voltage signal and on the reference current, where the one or more characteristics include a rise time and a fall time of the plurality of pulses and the digitally controlled rise/fall time generator is configured to ensure that a rise time and a fall time of the third voltage signal is in accordance with the rise time and the fall time specified by the one or more parameters, and
a current generator configured to generate the test current signal based on the third voltage signal.

17. The optical range finder according to claim 16, wherein the photodiode emulation circuitry further includes a digitally controlled mirror configured to generate a mirror output based on the reference current, and wherein the current generator is configured to generate the test current signal further based on the mirror output.

18. The optical range finder according to claim 17, wherein the photodiode emulation circuitry further includes a digitally controlled load configured to emulate a load capacitance of a photodiode while the photodiode emulation circuitry provides the test current signal to the TIA.

19. The optical range finder according to claim 16, wherein the photodiode emulation circuitry is configured to generate the test current signal without using optical-to-electrical conversion.

20. The optical range finder according to claim 16, wherein the optical range finder is a light detection and ranging (LIDAR) system.

21. The optical range finder according to claim 16, further comprising a light source and a light sensor, wherein the light source and the light sensor are configured to implement time-of-flight measurements to determine distance information to one or more objects.

* * * * *